United States Patent
Golubtsov et al.

(10) Patent No.: US 7,340,706 B2
(45) Date of Patent: Mar. 4, 2008

(54) METHOD AND SYSTEM FOR ANALYZING THE QUALITY OF AN OPC MASK

(75) Inventors: Ilya Golubtsov, Moscow (RU); Stanislav V. Aleshin, Moscow (RU); Ranko Scepanovic, San Jose, CA (US); Sergei Rodin, Moscow (RU); Marina Medvedeva, Moscow (RU); Sergey V. Uzhakov, Moscow (RU); Evgueny E. Egorov, Moscow (RU); Nadya Strelkova, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 215 days.

(21) Appl. No.: 11/239,977

(22) Filed: Sep. 30, 2005

(65) Prior Publication Data

US 2007/0079277 A1    Apr. 5, 2007

(51) Int. Cl.
    *G06F 17/50* (2006.01)
(52) U.S. Cl. .......................... 716/5; 716/19
(58) Field of Classification Search .......... 716/5, 716/19, 21, 6; 430/5, 22, 30
    See application file for complete search history.

(56) References Cited

U.S. PATENT DOCUMENTS

| | | | |
|---|---|---|---|
| 6,704,921 B2 * | 3/2004 | Liu | 716/19 |
| 6,928,634 B2 * | 8/2005 | Granik et al. | 716/19 |
| 6,978,438 B1 * | 12/2005 | Capodieci | 716/21 |
| 7,155,698 B1 * | 12/2006 | Gennari | 716/19 |
| 7,237,221 B2 * | 6/2007 | Granik et al. | 716/19 |

* cited by examiner

*Primary Examiner*—Jack Chiang
*Assistant Examiner*—Binh Tat
(74) *Attorney, Agent, or Firm*—Strategic Patent Group, P.C.

(57) ABSTRACT

The present invention provides a method and system for analyzing the quality of an OPC mask. The method includes receiving a target layer from a target design, receiving an OPC mask layer from the OPC mask. The method also includes classifying each cell of at least one of the target layer and the OPC mask layer as either repeating or non-repeating, and for each repeating cell, recognizing geometric points in the target layer to determine quality measuring groups. The method also includes simulating the OPC mask layer based on the quality measuring groups, measuring edge placement errors (EPEs) based on at least one of the geometric points, and providing an EPE layer representing EPEs greater than an EPE threshold.

24 Claims, 7 Drawing Sheets

METHOD AND SYSTEM FOR ANALYZING THE QUALITY OF AN OPC MASK

FIELD OF THE INVENTION

The present invention relates to optical proximity correction in integrated circuit designs, and more particularly to a method and system for analyzing the quality of an OPC mask.

BACKGROUND OF THE INVENTION

The minimum feature sizes of integrated circuits (ICs) have been shrinking for years. Commensurate with this size reduction, various process limitations have made IC fabrication more difficult. One area of fabrication technology in which such limitations have appeared is photolithography.

An integral component of photolithographic apparatus is a "reticle" which includes a pattern corresponding to features at one layer in an IC design. As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process.

To remedy this problem, a reticle correction technique known as optical proximity correction (OPC) has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result, and a digital representation of a reticle or photomask design is modified to create an optically corrected or OPC mask. The modification is performed by a computer having appropriate software for performing OPC. A mask simulator is then used to emulate the wafer printing characteristics of the OPC mask during optical lithography, resulting in an OPC aerial image.

To calculate the quality of the OPC mask, process engineers manually compare the target design to the aerial image to determine if features patterned within the aerial image are within some threshold of the corresponding features in the target design. This is done by measuring distances between the points in the target design and the corresponding points in the aerial image. Evaluation of each point requires analysis of surrounding features in two-dimensions to determine whether problematic diffraction effects are likely. Places in the mask that result in distances greater than the specified threshold are corrected (e.g., serif or segment removal, for example), and the process is repeated until acceptable results are obtained. A problem with this process is that engineers must first manually identify the geometric points in the target design to compare to the aerial image, and then visually determine if the points in the target design are separated by less than the threshold from the corresponding points in the aerial image. Furthermore, when the aerial image deviates from the target design, the mask quality is typically analyzed only at particular locations.

Accordingly, what is needed is an improved method and system for analyzing the quality of an OPC mask. The present invention addresses such a need.

BRIEF SUMMARY OF THE INVENTION

The present invention provides a method and system for analyzing the quality of an OPC mask. The method includes receiving a target layer from a target design, receiving an OPC mask layer from the OPC mask. The method also includes classifying each cell of at least one of the target layer and the OPC mask layer as either repeating or non-repeating, and for each repeating cell, recognizing geometric points in the target layer to determine quality measuring groups. The method also includes simulating the OPC mask layer based on the quality measuring groups, measuring edge placement errors (EPEs) based on at least one of the geometric points, and providing an EPE layer representing EPEs greater than an EPE threshold.

According to the method and system disclosed herein, the layers indicate information about deviations of a print-image contour on the wafer from a target design.

DETAILED DESCRIPTION OF THE INVENTION

The present invention relates to optical proximity correction in integrated circuit designs, and more particularly to a method and system for analyzing the quality of an OPC mask. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The preferred embodiment of the present invention provides a method and system for analyzing the quality of an OPC mask. The method and system provide multiple analysis layers that characterize the quality of an OPC mask by simulating the lithographic process and analyzing the results. The analysis layers characterize information about deviations of a print-image contour on the wafer from a target design.

Figure 1:
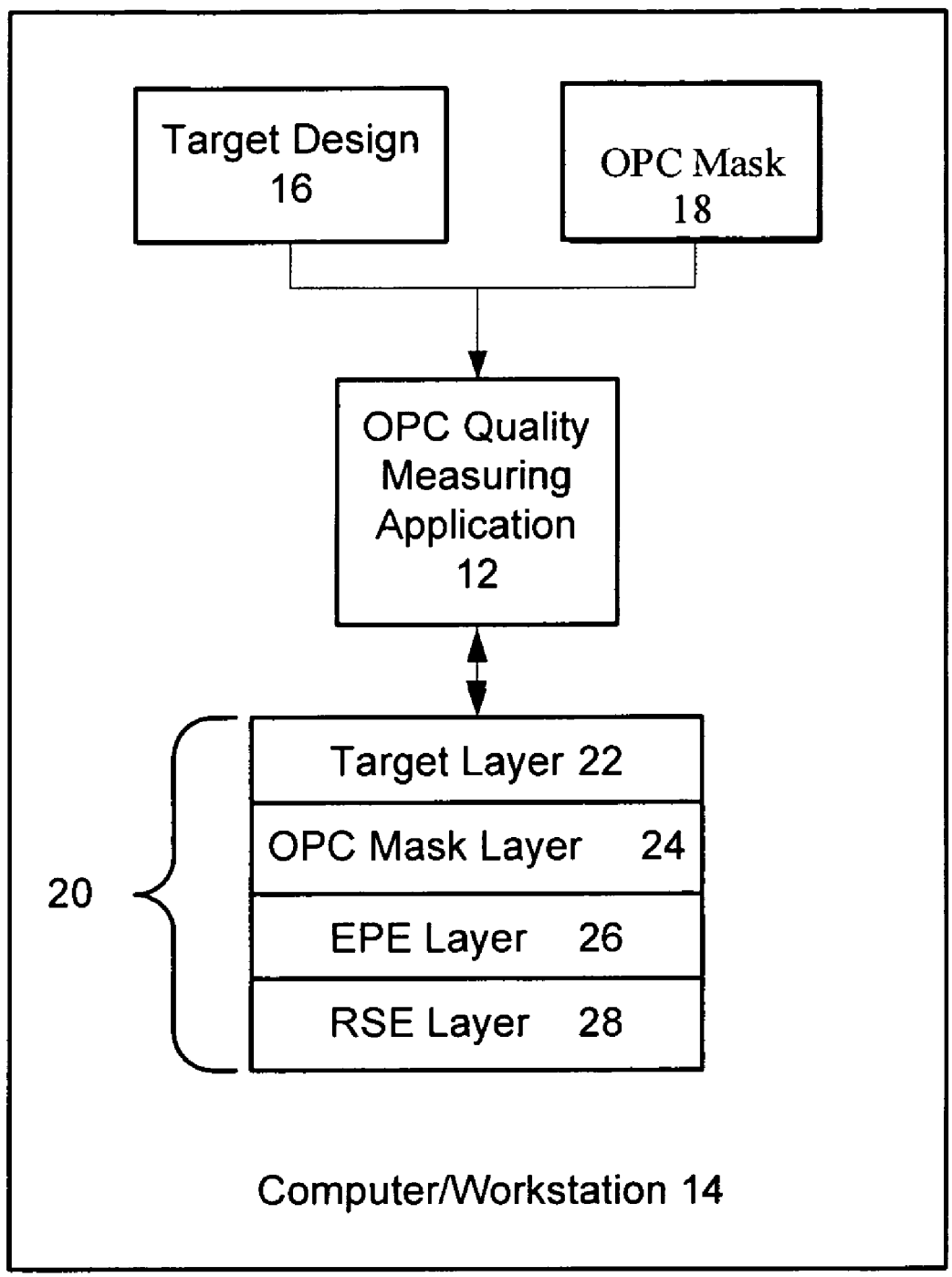
FIG. 1 is a block diagram illustrating an OPC quality measuring system for analyzing the quality of an OPC mask according to a preferred embodiment of the present invention.

FIG. 1 is a block diagram illustrating an OPC quality measuring system 10 for analyzing the quality of an OPC mask according to a preferred embodiment of the present invention. The system 10 includes a quality checking software application 12 executed on a processor in a computer/workstation 14 or on a server that is accessed over a network (not shown). The workstation 14 preferably includes a microprocessor that is coupled to a non-volatile storage device, e.g. a conventional hard disk storage device. The microprocessor and the hard disk storage device are coupled to a volatile storage device, e.g. Ea random access memory (RAM). A monitor may be coupled to the workstation for displaying a user interface.

Inputs to the quality checking application 12 are a target design 16 (i.e. a desired IC pattern) and an OPC mask 18 (i.e. an OPC-corrected reticle pattern). The OPC mask 18 is a result of optical proximity correction of the target design 16 and is a digital representation of a reticle/photomask pattern that has been optically corrected using OPC. Preferably, the target design 16 and the OPC mask 18 are described in an electronic format, e.g. graphic design system (GDS) or GDS II, which may represent individual features in the target design 16 and in the OPC mask as a set of x, y points. According to a preferred embodiment, the quality checking application 12 analyzes the target design 16 and the OPC mask 18 to create analysis layers 20. These analysis layers include a target layer 22, an OPC mask layer 24, an edge placement error (EPE) layer 26, and a relative square error (RSE) layer 28. As is described in detail below, these analysis layers also provide comprehensive information about portions of a chip that may have poor mask quality.

Figure 2:
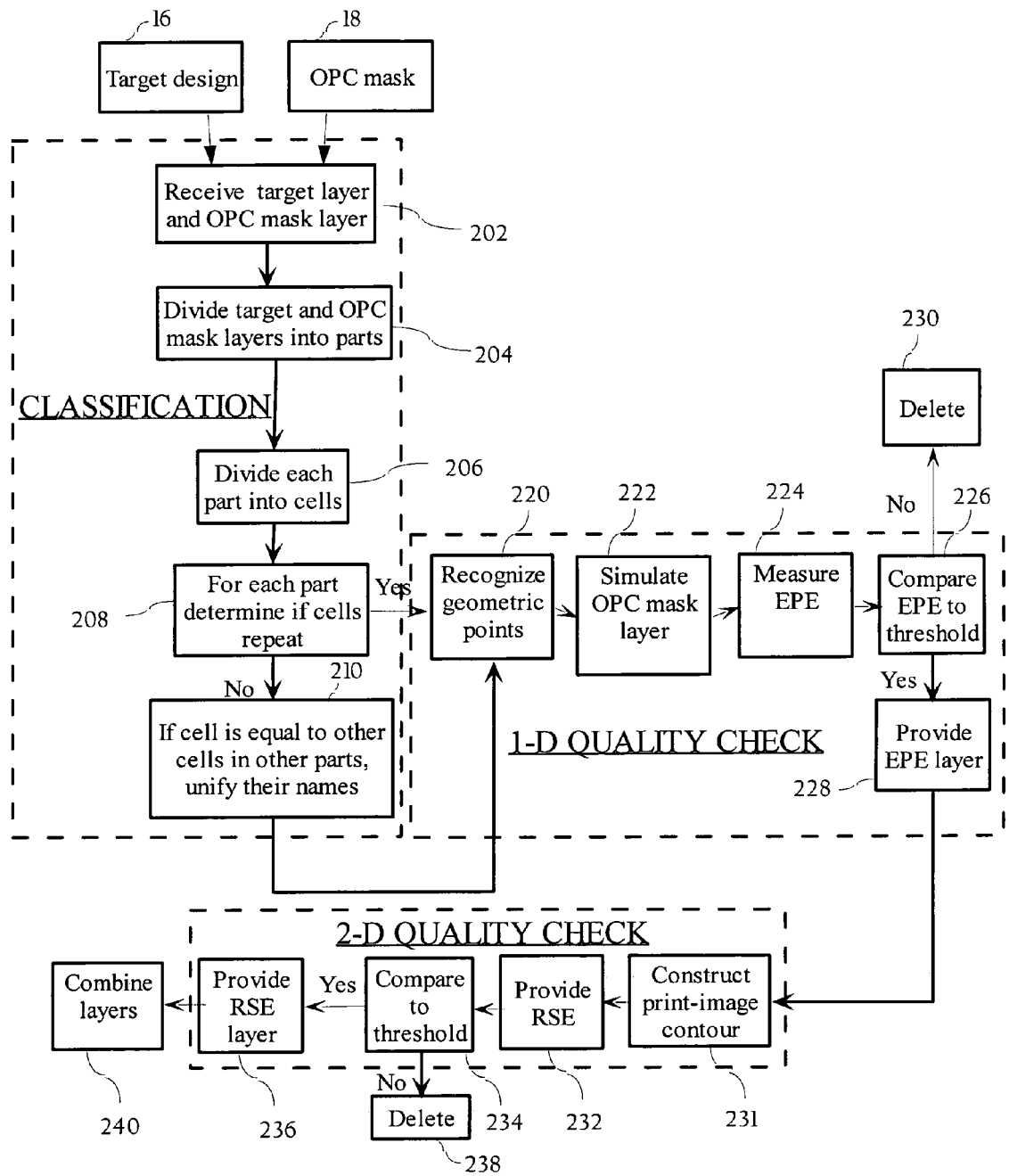
FIG. 2 is a flow diagram illustrating the process for classifying features of the target design and the OPC mask and for performing quality checks on the OPC mask in accordance with a preferred embodiment.

FIG. 2 is a flow diagram illustrating the process for classifying features of the target design 16 and the OPC mask 18 and for performing quality checks on the OPC mask 18 in accordance with the preferred embodiment. The quality measuring application 12 performs the process on each feature in the target design 16 and the OPC mask 18. The process includes three phases shown by the dashed boxes: classification, a 1-D quality check, and a 2-D quality check. According the preferred embodiment, the classification phase determines which cells in a new hierarchy (obtained by dividing the chip into cells) in the design repeat in the design. The 1-D quality check simulates the wafer printing characteristics of the OPC mask at identified portions of the geometric points of all cells in the new hierarchy, and performs an edge placement error (EPE) measurement on the simulated cells to identify areas of the design that fail to meet a 1-D error threshold. In the case of unsatisfactory 1D-quality for a given cell (i.e., the cell fails to meet a 1-D error threshold), the 2-D quality check then simulates the OPC mask of the entire cell and calculates RSE based on print-image contour shape and position.

A. Classification

Classification begins in step 202 by receiving the target layer 22 from the target design 16 and the OPC mask layer 24 from the OPC mask 18. Next, in step 204, the quality measuring application 12 divides each of the target and OPC mask layers 22 and 24 into parts, where each part comprises cells. Next, in step 206, the classification procedure divides each part into cells. A cell comprises a set of features having feature boundaries represented as geometric points. A cell also comprises calls (i.e. references) to other cells (as in a GDS format). The geometric points are presented in target layer 22.

Next, in step 208, the classification procedure determines if each cell repeats within a given part. At this stage the cells contain both of the target and OPC mask layers 22 and 24. In step 210, for the cells that are identified as non-repeating cells in step 208, the classification procedure determines if each of those cells repeat in other parts, and if so, unifies their names. In the preferred embodiment, cells that are identified as repeating cells undergo both 1-D and 2-D quality checks. In the preferred embodiment, only one cell of a set of repeating cells is analyzed in the 1-D and 2-D quality checks. This reduces the number of features (i.e. cells) to be processed, thus reducing the amount of computation resources and time to perform the 1-D and 2-D quality checks.

Non-repeating cells are also analyzed during the 1-D and 2-D quality checks, but after being compared with the cells in other parts of the chip and after unifying names of the same cells. Unifying cell names from the different parts of the chip further reduces the amount of computation resources and time to perform the 1-D and 2-D quality checks.

B. One-Dimensional Quality Check

Generally, during the 1-D quality check, the features in the cells of the target layer 22 are compared with the result of OPC mask layer 24 simulation near particular geometric points.

The 1-D quality check involves three stages: geometry recognition, OPC mask simulation, and edge placement error (EPE) measurement. The results of the 1-D quality check may then be used for further analysis of the OPC mask 18.

B.1. Geometry Recognition

Referring again to FIG. 2, according to a preferred embodiment, the quality checking application 12 in step 220 analyzes the target design 16 and automatically recognizes/identifies geometric points in features in the target design 16 that are critical to be used for OPC mask calculations. These geometric points are output in the form of OPC quality measuring groups 20, which preferably includes a critical dimension (CD) group 22 having CD points, an end-of-line (EOL) group 24 having EOL points, and a space group 26 having points to measure spaces between features. Every CD point and space point in the CD and space groups 22 and 26 is described with two x, y points. Every EOL point in the EOL group 24 is described with one x, y point. The calls (i.e. references) to the cells that do not contain recognized geometric points are deleted from the quality checks and the mask quality check ends for those cells. This further reduces the number features to be processed, thus further reducing the amount computation resources and time required to perform the 1-D and 2-D quality checks.

B.2. OPC Mask Simulation

Next, in step 222, the quality checking software application 12 uses the OPC mask layer 24 to simulate an optical lithographic process. In the preferred embodiment, the OPC mask simulation is based on the OPC quality measuring groups described above. In a preferred embodiment, the result/output of the simulation is an OPC aerial image near the recognized geometric points, or "aerial image," which is a top-view image of a simulated wafer pattern near the recognized geometric points. In other words, the aerial image emulates the wafer printing characteristics of an OPC mask during optical lithography.

B.3. Edge Placement Error

Figure 3:
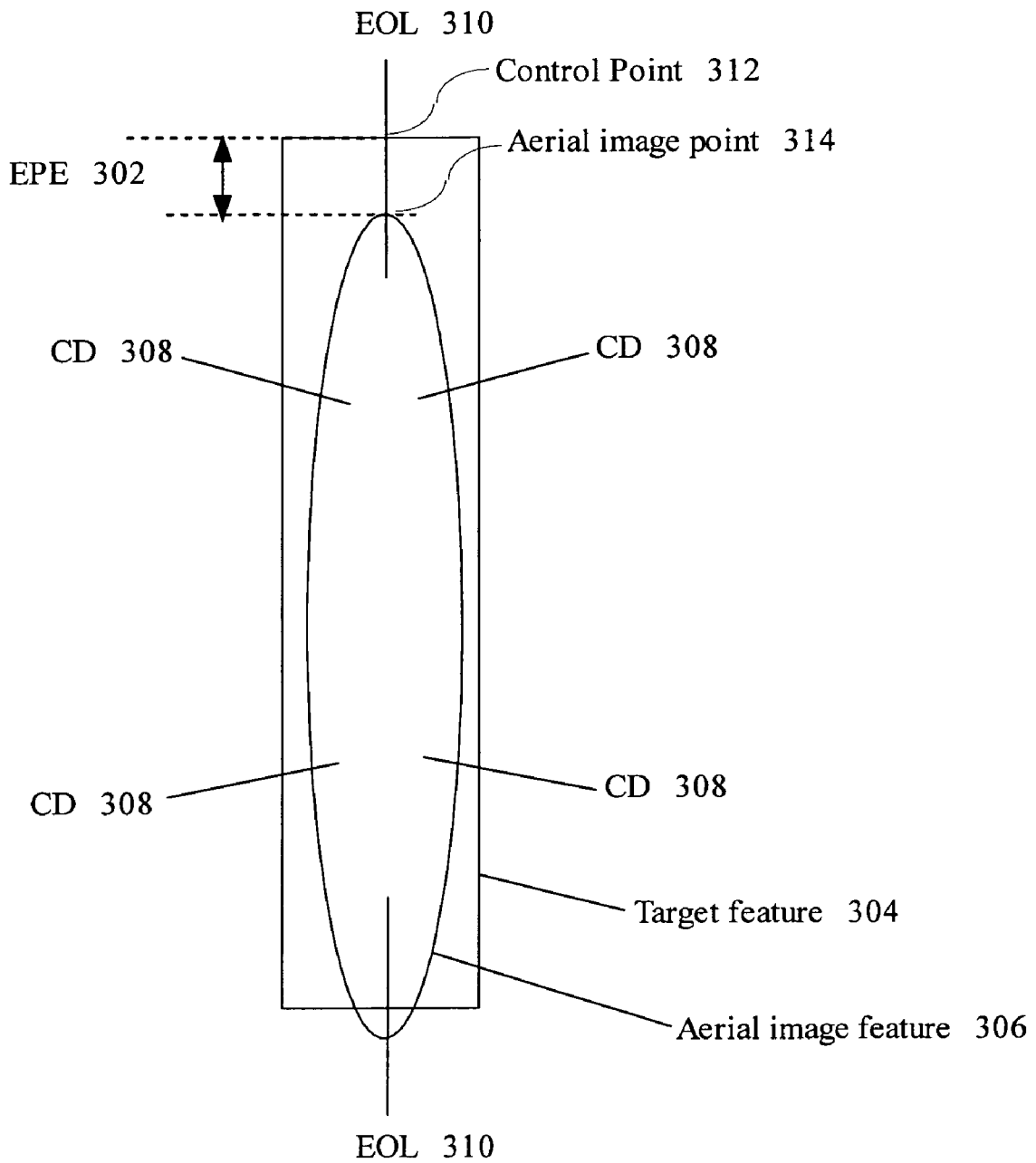
FIG. 3 is a diagram illustrating an edge placement error measurement in accordance with the present invention.

Next, in step 224, the quality measuring application 12 measures the edge placement error one or more geometric points. FIG. 3 is a diagram illustrating an example edge placement error measurement 302, or "EPE" 302, in accordance with the preferred embodiment. FIG. 3 shows a target feature 304, an aerial image feature 306, CDs 308, EOLs 310, and the EPE 302. The EPE 302 at each control point of the feature is the measured distance between an edge control point 312 and an aerial image point 314, which is a point on the aerial image feature 306 that is normal to the feature edge. The control point 312 is a geometric point obtained from the recognition process and functions as a reference point when the quality checking software application 12 measures the EPE 302.

Referring again to FIG. 2, in step 226, the quality measuring application 12 compares each EPE to an edge placement tolerance, or "EPE threshold." In step 228, if there is some EPE for a given control point, and if the EPE is greater than the EPE threshold, an image of the EPE at the control point is created and is used to provide an EPE layer, which characterizes those EPEs greater than the EPE threshold. In step 230, if the EPE for a given cell is less than the EPE threshold, the cell is considered as satisfactory, and the calls to that cell are deleted from the hierarchy.

After the 1-D quality check completes, the 2-D quality check is executed. The 2-D quality check is referred to as a 2-D quality check, because the relative square error, which is described in detail below, is a two-dimensional characteristic, whereas an EPE is a one-dimensional characteristic. Each cell that is not determined to be satisfactory during the 1-D quality check is checked during the 2-D quality check.

C. Two-Dimensional Quality Check

The two-dimensional (2-D) quality check involves two stages: print-image contour construction and square error calculation. The results of the 2-D quality check may then be used for further analysis of the OPC mask.

C.1. Construct Print-Image Contour

Referring again to FIG. 2, in step 231, the quality measuring application 12 constructs a print-image contour. The print-image contour shows the boundary contours for each cell. In the preferred embodiment, the print-image contour is represented as the set of geometric points that satisfy the following equation, which factors in location and shape: $I(x,y)=const$, where $I(x, y)$ is the spatial intensity distribution of the electric field inside the resist material, that will be used during the photolithography process, and where const is the intensity value on the contour.

The algorithm for a fast construction of the print-image contour and the calculation of its square error with respect to a corresponding target feature are described below.

Figure 4:
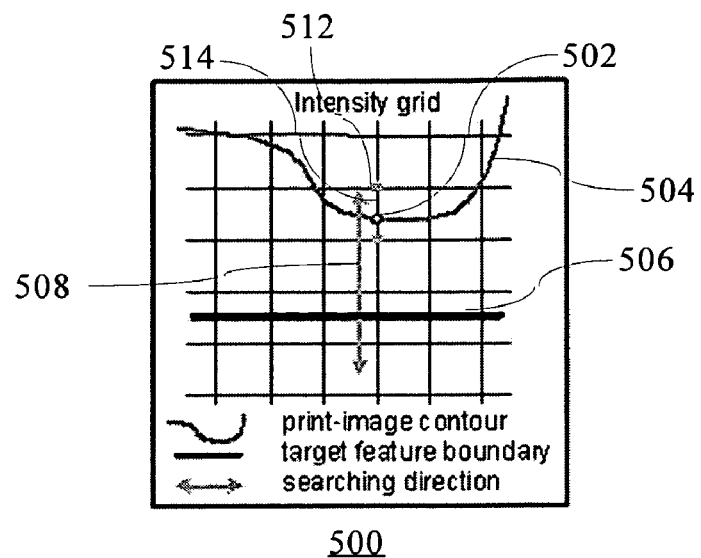
FIG. 4 is a diagram illustrating an intensity grid, including a first contour point, in accordance with the present invention.

FIG. 4 is a diagram illustrating an intensity grid 500, including a first contour point 502, in accordance with the present invention. FIG. 4 shows the contour point 502 on a print-image contour 504, a target feature boundary 506, and a searching direction line 508. The print-image contour 504 is built from a series of contour points provided on the intensity grid 500, which is a matrix of intensity values. In the preferred embodiment, the first contour point 502 is provided in the following manner. First, the searching direction line 508 is provided. The searching direction line 508 is orthogonal to and passing through the center of the target feature boundary 506. The target feature boundary is provided by the target layer. Next, a node 510 on the intensity grid 500 nearest to the print-image contour 508 and arranged close to the searching direction line 508 is provided. The intensity values in each grid node are known from the aerial image and used to find the first contour point. Next, an adjacent node 512 nearest to and on the other side of the print-image contour 504 is provided. These two nodes 510 and 512 form an intensity grid gate 514 through which the print-image contour 508 passes. Next, the first contour point 502 is calculated using a quadratic approximation of intensity values around particular gate. If the first contour point near the center of the target feature boundary 506 cannot be found, then the above-described algorithm is applied to the other segments.

Figure 5:
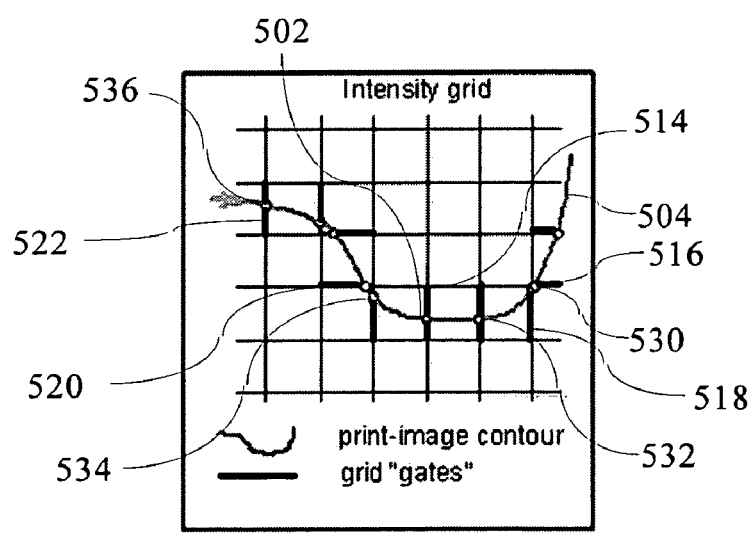
FIG. 5 is a diagram illustrating an intensity grid, including grid gates, in accordance with the present invention.

FIG. 5 is a diagram illustrating an intensity grid 500, including grid gates 514-522, in accordance with the present invention. FIG. 5 shows the print-image contour 504 passing through the grid gates 602. After the first grid gate 514 is provided, the adjacent grid gates 516-522 and respective adjacent contour points 532-536 are provided by analyzing the intensity value at the grid nodes adjacent to the first gate. Thus, the whole print-image contour can be constructed with help of a consecutive procedure of finding adjacent grid gates and using quadratic approximations. The construction of the print-image contour 504 ends when a contour point coincident with the first contour point 502 is provided.

C.2. Calculate Square Error

Figure 6:
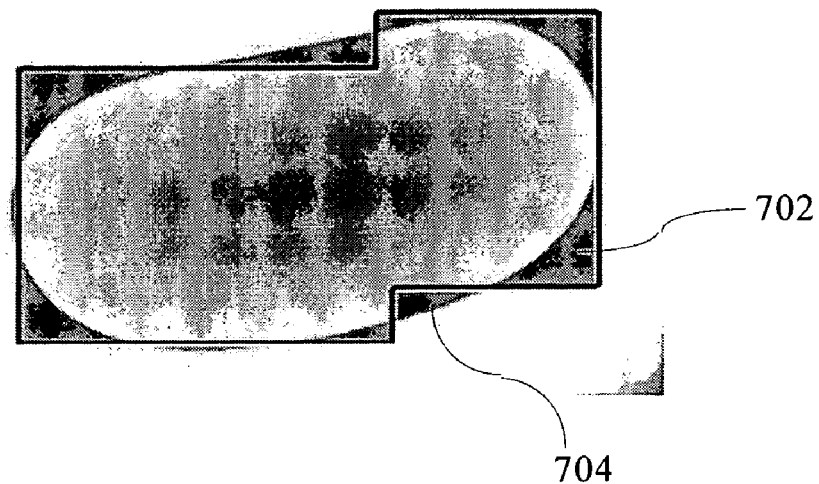
FIG. 6 is an image illustrating a relative square error of a print-image contour in accordance with the present invention.

Referring again to FIG. 2, in step 232, the quality measuring application 12 calculates the relative square error. FIG. 6 is an image illustrating a relative square error 702 of a print-image contour 704 in accordance with the present invention. The relative square error 702 is calculated based on the location and shape of the print-image contour. The relative square error 702 of the print-image contour 704 is the error of a printed (i.e., simulated) feature with respect to target feature. More specifically, the relative square error 702 is defined as an area of the geometrical figure, which is the locus composed by the points only of a boundary of only an aerial image. Thus, this locus can be represented as the square of the result of the XOR function between feature image of the target layer and a corresponding feature image of the aerial image derived from the results of the OPC mask layer simulation divided by the square of the feature image of the target layer.

Figure 7:
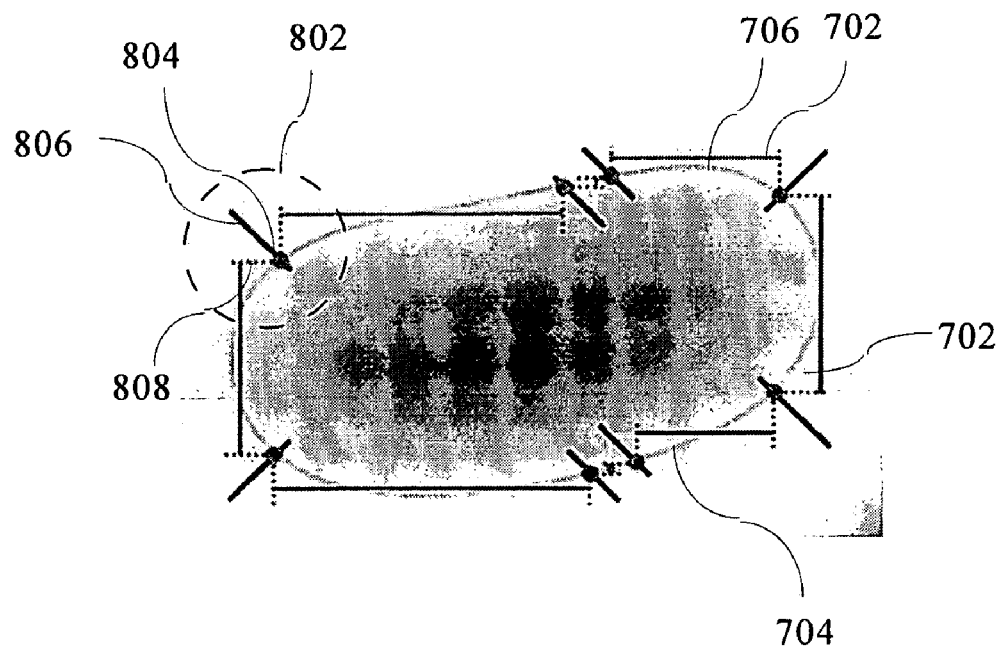
FIG. 7 is an image illustrating the relative square error of FIG. 6 modified to include fragmentations in accordance with the present invention.

FIG. 7 is an image illustrating the relative square error 702 of FIG. 6 modified to include fragmentations in accordance with the present invention. FIG. 7 also shows a fragmentation 802 and the print-image contour 704. Referring to the fragmentation 802 of FIG. 8, a contour point 804 is a point which is intersected by a bisector 806. There is a contour point at each target boundary corner. Projections 808 of the contour point 804 are on the sides of the corresponding angles. This achieves one-to-one mapping between contour fragments 706 and boundary segments 708, which enables the correct calculation of the relative square error (RSE) of complicated boundaries.

Referring again to FIG. 2, in step 234, the quality measuring application 12 compares each RSE to a predetermined customer parameter, or "RSE threshold." In step 236, if the RSE is greater than the RSE threshold, an image of the RSE is created and used to provide an RSE layer, which characterizes those RSEs greater that the RSE threshold. A customer parameter may be, for example, an EPE greater than 10 nm and a square error greater then 20% of target feature size. In step 238, if the RSE for a given cell is less than the RSE threshold, the cell is considered as satisfactory, and the calls to that cell are deleted from the hierarchy.

Figure 8:
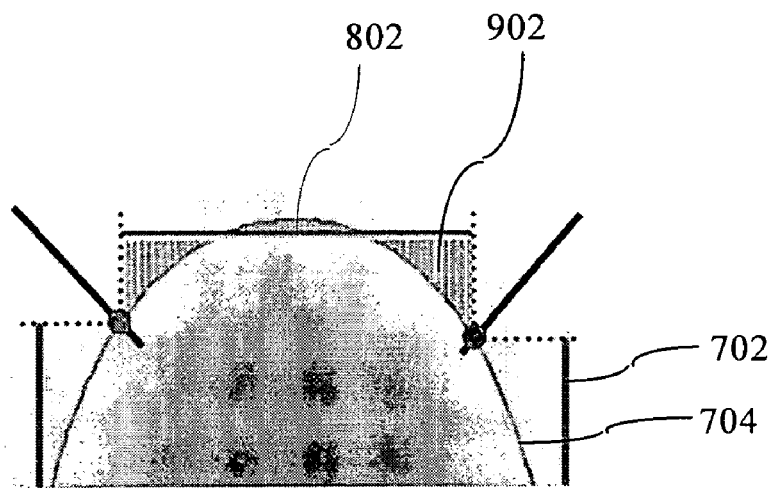
FIG. 8 is an image illustrating the relative square error of FIG. 6 modified to include an area deviation near a segment in accordance with the present invention.
Figure 9:
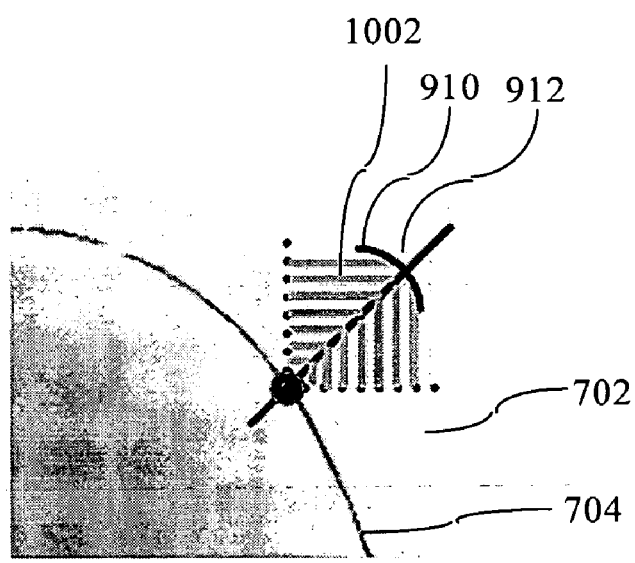
FIG. 9 is an image illustrating the relative square error of FIG. 6 modified to include an area deviation near an angle in accordance with the present invention.

FIG. 8 is an image illustrating the relative square error 702 of FIG. 6 modified to include an area deviation 902 near a segment 802 in accordance with the present invention. FIG. 9 is an image illustrating the relative square error 702 of FIG. 6 modified to include an area deviation 1002 near an angle in accordance with the present invention. Referring to both FIGS. 8 and 9, FIGS. 8 and 9 also show the print-image contour 704. Referring to FIG. 9, for each segment 802, area deviations of the print-image contour are calculated using an integration algorithm that is based on trapezoids. At each angle, an area deviation of the print-image contour is calculated as a square of two right triangles. An allowable area deviation at the angle is subtracted from the result. This area deviation is defined by a curvature radius 910 of a corner 912, which is a manufacturing specification parameter.

Figure 10:
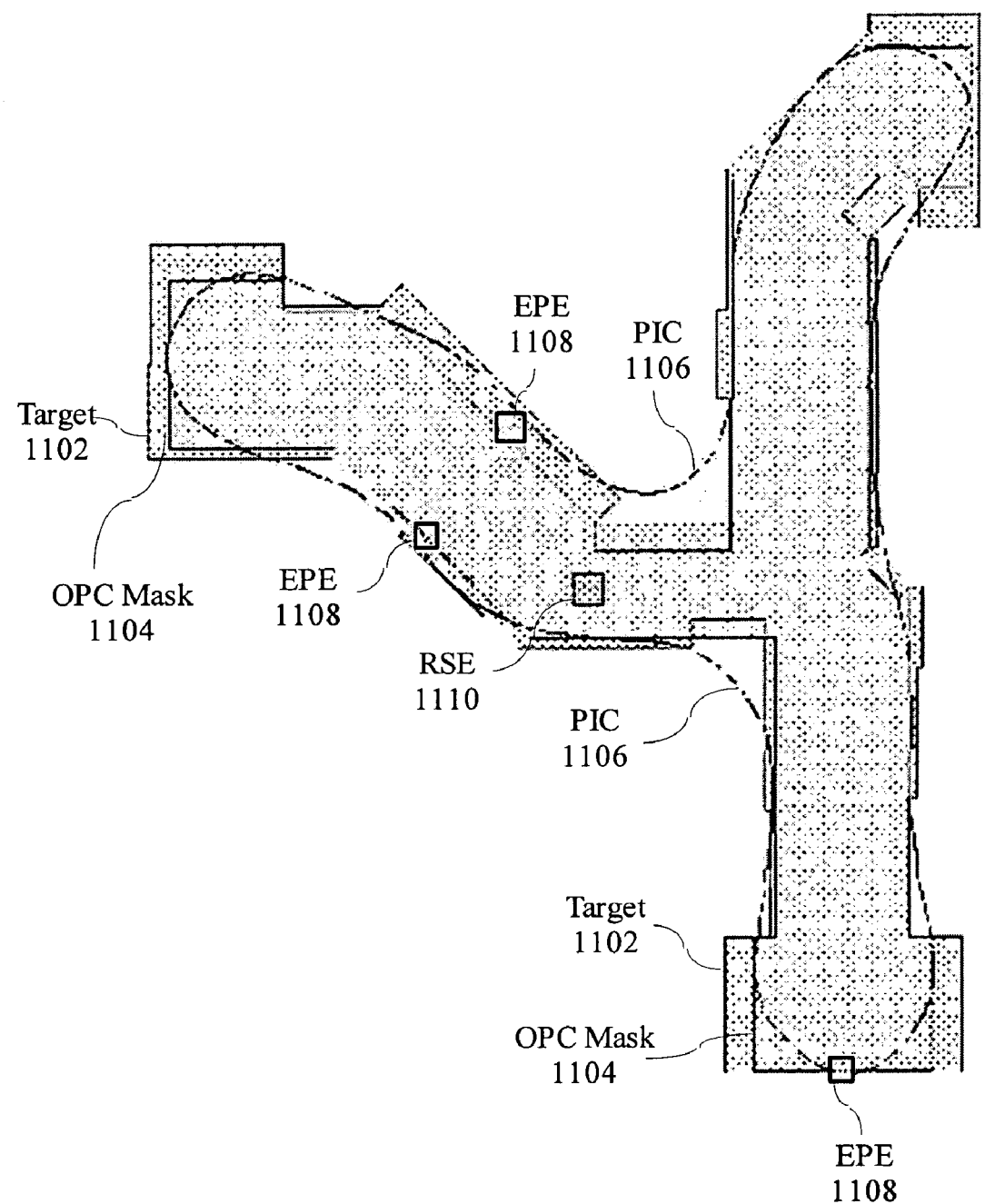
FIG. 10 is an image illustrating analysis elements in accordance with one embodiment of the present invention.

FIG. 10 also shows the print-image contour 704. A sum of area deviations near all segments and angles of the boundary is divided by the area of the entire boundary and the result is the relative square error of the print-image contour. All cells determined to be non-repeating local cells in the classification procedure above are combined and checked for the repetition. As described above, a chip design is divided into multiple cells. Since the cells are independently classified and classified in parallel, certain cells may be repeating cells but not identified as repeating during the classification procedure. At this point in the process, all of the non-repeating cells are combined and checked to see if any are repeating. Then, the above-described quality checks are performed on the new repeating cells.

To reduce computation time, the portions of the quality checks may be performed in parallel. These layers may be interfaced or may be stored in a database. In a preferred embodiment, all of the information collected during the quality checks is saved in a GDS file.

When all quality checks have been performed, in step 240, the quality measuring application 12 combines the target layer 22, the OPC mask layer 24, the EPE layer 26, and the RSE layer 28, and the process ends. The layers may then be visually presented in a graphical user interface. For example, FIG. 10 is an image illustrating analysis elements in accordance with one embodiment of the present invention. FIG. 10 shows a target layer 1102, an OPC mask layer 1104, a print-image contour layer 1106, EPE locations 1108, and square error locations 1110. These analysis layers provide a useful comparison tool that may serve several functions such as mask quality analysis. For example, a customer can define where the customer wants to change a given mask in order to improve the OPC mask for improved optimal results in a semiconductor process.

Embodiments of the present invention analyze not only the deviation of the print-image contour from target design at specific places, but also analyze the deviation of the areas of print-image contour and the corresponding target features in the target design. This allows an engineer to analyze the mask quality in a detailed manner, obtaining more complete and comprehensive information about shape and sizes of the print-image contours of the whole chip.

A method and system for analyzing the quality of an OPC mask has been disclosed. The present invention has been described in accordance with the embodiments shown. One of ordinary skill in the art will readily recognize that there could be variations to the embodiments, and that any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Consequently, a computer-readable medium is intended to include a computer readable signal, which may be, for example, transmitted over a network. Accordingly, many modifications may be made by one of ordinary skill in the art without departing from the spirit and scope of the appended claims.

We claim:

1. A method for analyzing the quality of an optical proximity correction (OPC) mask, the method comprising:
   receiving a target layer from a target design;
   receiving an OPC mask layer from the OPC mask;
   classifying each cell of at least one of the target layer and the OPC mask layer as either repeating or non-repeating;
   for each repeating cell, recognizing geometric points in the target layer to determine quality measuring groups and wherein the recognizing comprises:
   identifying geometric points in features of the target design to be used for OPC mask layer calculations; and
   outputting the geometric points in the form of the OPC quality measuring groups;
   simulating the OPC mask layer based on the quality measuring groups;
   measuring edge placement errors (EPEs) based on at least one of the geometric points; and
   providing an EPE layer representing EPEs greater than an EPE threshold.

2. The method of claim 1 further comprising:
   dividing each of the target and OPC mask layers into a plurality of parts; and
   dividing each part of the plurality of parts into a plurality of cells comprising a plurality of geometric points.

3. The method of claim 1 wherein the OPC quality measuring groups comprise at least one of a critical dimension (CD) group having CD points, an end-of-line group having EOL points, and a space group having points to measure spaces between features.

4. The method of claim 1 wherein the measuring comprises:
   providing an aerial image comprising a feature edge of a quality measuring group, wherein the quality measuring group is derived from the geometric points;
   determining at least one EPE by measuring the differences between the geometric points in the aerial image and corresponding geometric points in the target layer.

5. The method of claim 1 further comprising providing an EPE layer based on EPEs that are greater than a predetermined EPE threshold, wherein the EPE layer characterizes those EPEs.

6. The method of claim 1 further comprising:
   constructing a contour; and
   calculating a relative square error based on the contour.

7. The method of claim 6 wherein the constructing comprises:
   providing boundary of a feature on a grid;
   providing on the grid a line on that is orthogonal to passing through the boundary;
   providing on the grid a first node nearest to the contour and close to the line;
   providing on the grid a second node nearest to the contour and on the other side of the contour, wherein the first and second nodes form a grid gate; and
   providing a first contour point based a quadratic approximation of intensity values around particular gate.

8. The method of claim 7 wherein the constructing is repeated to provide a plurality of contour points.

9. The method of claim 6 wherein the calculating is based on an area that is a locus of a feature image from of the target layer and a corresponding feature image of an aerial image.

10. The method of claim 6 further comprising providing a relative square error (RSE) layer based on RSEs that are greater than a predetermined RSE error threshold, wherein the RSE layer characterizes those RSEs.

11. An OPC quality measuring system, comprising:
a target design in an electronic format that represents individual features as a set of x, y points; and
a quality checking software application executing on processor for analyzing the target design by,
receiving a target layer from a target design;
receiving an OPC mask layer from the OPC mask;
classifying each cell of at least one of the target layer and the OPC mask layer as either repeating or non-repeating;
for each repeating cell, recognizing geometric points in the target layer to determine quality measuring groups and wherein the recognizing comprises:
identifying geometric points in features of the target design to be used for OPC mask layer calculations; and
outputting the geometric points in the form of the OPC quality measuring groups;
simulating the OPC mask layer based on the quality measuring groups;
measuring edge placement errors (EPEs) based on at least one of the geometric points; and
providing an EPE layer representing EPEs greater than an EPE threshold.

12. The system of claim 11 further comprising:
dividing each of the target and OPC mask layers into a plurality of parts; and
dividing each part of the plurality of parts into a plurality of cells comprising a plurality of geometric points.

13. The system of claim 11 wherein the OPC quality measuring groups comprise at least one of a critical dimension (CD) group having CD points, an end-of-line group having EOL points, and a space group having points to measure spaces between features.

14. The system of claim 11 wherein the measuring comprises:
providing an aerial image comprising a feature edge of a quality measuring group, wherein the quality measuring group is derived from the geometric points;
determining at least one EPE by measuring the differences between the geometric points in the aerial image and corresponding geometric points in the target layer.

15. The system of claim 11 further comprising providing an EPE layer based on EPEs that are greater than a predetermined EPE threshold, wherein the EPE layer characterizes those EPEs.

16. The system of claim 11 further including: outputting the quality measuring points into quality measuring groups, including a Critical Dimension (CD) group having CD points, an End-of-line (EOL) group having EOL points, and a Space group having points to measure spaces between features.

17. The system of claim 11 further comprising:
constructing a contour; and
calculating a relative square error based on the contour.

18. The system of claim 17 wherein the constructing comprises:
providing boundary of a feature on an grid;
providing on the grid a line on that is orthogonal to passing through the boundary;
providing on the grid a first node nearest to the contour and close to the line;
providing on the grid a second node nearest to the contour and on the other side of the contour, wherein the first and second nodes form a grid gate; and
providing a first contour point based a quadratic approximation of intensity values around particular gate.

19. The system of claim 18 wherein the constructing is repeated to provide a plurality of contour points.

20. The system of claim 17 wherein the calculating is based on an area that is a locus of a feature image from of the target layer and a corresponding feature image of an aerial image.

21. The system of claim 17 further comprising providing a relative square error (RSE) layer based on RSEs that are greater than a predetermined RSE error threshold, wherein the RSE layer characterizes those RSEs.

22. A computer-readable medium containing program instructions for analyzing the quality of an OPC mask, the program instructions which when executed by a computer system cause the computer system to execute a method comprising:
receiving a target layer from a target design;
receiving an OPC mask layer from the OPC mask;
classifying each cell of at least one of the target layer and the OPC later as either repeating or non-repeating;
for each repeating cell, recognizing geometric points in the target layer to determine quality measuring groups and wherein the recognizing comprises:
identifying geometric points in features of the target design to be used for OPC mask layer calculations; and
outputting the geometric points in the form of the OPC quality measuring groups;
simulating the OPC mask layer based on the quality measuring groups;
measuring edge placement errors (EPEs) based on at least one of the geometric points; and
providing an EPE layer representing EPEs greater than an EPE threshold.

23. The computer-readable medium of claim 22 further comprising program instructions for:
dividing each of the target and OPC mask layers into a plurality of parts; and
dividing each part of the plurality of parts into a plurality of cells comprising a plurality of geometric points.

24. The computer-readable medium of claim 22 further comprising program instructions for:
constructing a contour; and
calculating a relative square error based on the contour.

* * * * *